(12) United States Patent
Yoon et al.

(10) Patent No.: US 11,888,489 B2
(45) Date of Patent: Jan. 30, 2024

(54) DELAY LOCKED LOOP INCLUDING REPLICA FINE DELAY CIRCUIT AND MEMORY DEVICE INCLUDING THE SAME

(71) Applicant: SAMSUNG ELECTRONICS CO., LTD., Suwon-si (KR)

(72) Inventors: Junsub Yoon, Seoul (KR); Hun-Dae Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/888,199

(22) Filed: Aug. 15, 2022

(65) Prior Publication Data
US 2023/0253971 A1 Aug. 10, 2023

(30) Foreign Application Priority Data

Feb. 7, 2022 (KR) .................. 10-2022-0015721

(51) Int. Cl.
*H03L 7/081* (2006.01)
*G11C 7/22* (2006.01)
*H03L 7/083* (2006.01)

(52) U.S. Cl.
CPC ............ *H03L 7/0818* (2013.01); *G11C 7/222* (2013.01); *G11C 7/225* (2013.01); *H03L 7/083* (2013.01); *H03L 7/0814* (2013.01); *H03L 7/0816* (2013.01)

(58) Field of Classification Search
CPC ................. H03L 7/0812–1818; G11C 7/22
See application file for complete search history.

(56) References Cited

U.S. PATENT DOCUMENTS

| | | | |
|---|---|---|---|
| 6,985,401 B2 | 1/2006 | Jang et al. | |
| 7,385,428 B2 | 6/2008 | Lee et al. | |
| 7,605,623 B2 | 10/2009 | Yun et al. | |
| 8,593,208 B2 | 11/2013 | Kim | |
| 10,218,342 B2 | 2/2019 | Kitagawa | |
| 10,250,265 B2 | 4/2019 | Qi et al. | |
| 10,608,648 B2 | 3/2020 | Qi et al. | |
| 2008/0001642 A1 | 1/2008 | Yun et al. | |
| 2011/0267118 A1* | 11/2011 | Shin ............... | H03L 7/0818 327/158 |
| 2018/0123601 A1* | 5/2018 | Jeon ............... | G11C 7/222 |
| 2021/0217457 A1 | 7/2021 | Satoh | |

FOREIGN PATENT DOCUMENTS

| | | |
|---|---|---|
| KR | 10-0546135 B1 | 1/2006 |
| KR | 10-0645461 B1 | 11/2006 |

* cited by examiner

*Primary Examiner* — Patrick O Neill
(74) *Attorney, Agent, or Firm* — Sughrue Mion, PLLC

(57) ABSTRACT

In some embodiments of the present disclosure, a delay locked loop includes a coarse delay circuit configured to delay a reference clock signal to generate a first clock signal, a fine delay circuit configured to delay the first clock signal to generate a second clock signal, a first delay circuit configured to delay the second clock signal to generate a third clock signal, a second delay circuit configured to delay the first clock signal to generate a fourth clock signal, a third delay circuit configured to delay the fourth clock signal to generate a fifth clock signal, a phase detector configured to detect a phase difference between the reference clock signal and the fifth clock signal, and a controller configured to adjust, a first delay amount of the coarse delay circuit, a second delay amount of the fine delay circuit and a third delay amount of the third delay circuit.

20 Claims, 8 Drawing Sheets

DELAY LOCKED LOOP INCLUDING REPLICA FINE DELAY CIRCUIT AND MEMORY DEVICE INCLUDING THE SAME

CROSS-REFERENCE TO RELATED APPLICATIONS

This application claims priority from Korean Patent Application No. 10-2022-0015721, filed on Feb. 7, 2022, in the Korean Intellectual Property Office, the disclosure of which is incorporated herein by reference in its entirety.

BACKGROUND

1. Field

The present disclosure generally relates to a delay locked loop and a memory device including the same, and more particularly, to a delay locked loop including a replica fine delay circuit and a memory device including the same.

2. Description of Related Art

When an externally applied clock signal is used in an electronic device, a time delay (e.g., a clock signal skew) may occur due to internal circuits of the electronic device. A delay locked loop (DLL) may be used to compensate for the time delay. The delay locked loop may be necessary for synchronization of the electronic device with an external clock signal.

A related delay locked loop may include replica circuits of internal circuits for the purpose of synchronizing the electronic device with the external clock signal. However, as the number of replica circuits implemented by replicating the internal circuits increases, a delay may increase. In this case, a locking time of the delay locked loop may become longer (e.g., increase).

SUMMARY

Embodiments of the present disclosure provide a delay locked loop including a replica fine delay circuit and a memory device including the same.

According to an aspect of the present disclosure, there is provided a delay locked loop apparatus that includes a coarse delay circuit configured to delay a reference clock signal to generate a first clock signal, a fine delay circuit configured to delay the first clock signal to generate a second clock signal, a first delay circuit configured to delay the second clock signal to generate a third clock signal, a second delay circuit configured to delay the first clock signal to generate a fourth clock signal, a third delay circuit configured to delay the fourth clock signal to generate a fifth clock signal, a phase detector configured to detect a phase difference between the reference clock signal and the fifth clock signal, and a controller configured to adjust, based on a detection result of the phase detector, a first delay amount of the coarse delay circuit, a second delay amount of the fine delay circuit and a third delay amount of the third delay circuit.

In some embodiments, the third delay circuit may be configured to replicate the fine delay circuit.

In some embodiments, the second delay circuit may be configured to replicate the first delay circuit.

In some embodiments, the controller may be configured to adjust the second delay amount of the fine delay circuit and the third delay amount of the third delay circuit after having adjusted the first delay amount of the coarse delay circuit.

In some embodiments, the coarse delay circuit may include a plurality of first delay units. Each first delay unit of the plurality of first delay units may be configured to delay the reference clock signal by a first time duration. The fine delay circuit may include a plurality of second delay units. Each second delay unit of the plurality of second delay units may be configured to delay the first clock signal by a second time duration.

In some embodiments, the first time duration may be equivalent to a maximum delay time of the fine delay circuit.

In some embodiments, the controller may be further configured to generate a first code and a second code, adjust, using the first code, the first delay amount of the coarse delay circuit, and adjust, using the second code, the second delay amount of the fine delay circuit and the third delay amount of the third delay circuit.

In some embodiments, the delay locked loop apparatus may be further configured to output a synchronization signal in response to the third clock signal being synchronized with the reference clock signal.

In some embodiments, the controller may be further configured, based on a phase of the fifth clock signal being locked into a phase of the reference clock signal, to generate a locking signal and to synchronize read data with a data strobe signal using the locking signal.

According to an aspect of the disclosure, there is provided a memory device that includes a clock signal delay circuit configured to receive a reference clock signal and to provide the reference clock signal to an output circuit, and a delay locked loop that includes a replica fine delay circuit configured to replicate a fine delay circuit, a variable delay circuit, and a replica delay circuit. The variable delay circuit includes a coarse delay circuit and the fine delay circuit. The coarse delay circuit is configured to delay the reference clock signal to generate a first clock signal. The fine delay circuit is configured to delay the first clock signal to generate a second clock signal. The replica delay circuit is configured to delay the first clock signal to generate a fourth clock signal. The replica fine delay circuit is configured to delay the fourth clock signal to generates a fifth clock signal.

In some embodiments, the delay locked loop may further include a phase detector configured to receive the reference clock signal and the fifth clock signal and to detect a phase difference between the reference clock signal and the fifth clock signal, and a controller configured to generate a first code and a second code based on a detection result of the phase detector.

In some embodiments, the controller may be further configured to adjust, using the first code, a first delay amount of the coarse delay circuit, and to adjust, using the second code, a second delay amount of the fine delay circuit and a third delay amount of the replica fine delay circuit.

In some embodiments, the memory device may further include a clock signal buffer configured to receive an input clock signal from outside of the memory device and to generate the reference clock signal.

In some embodiments, the replica delay circuit may be further configured to replicate the clock signal buffer, the clock signal delay circuit, and the output circuit.

In some embodiments, the memory device may further include a data output circuit configured to output a data strobe signal that is synchronized with the reference clock signal based on a read command received from outside of the memory device.

In some embodiments, the controller may be further configured, based on a phase of the fifth clock signal being locked into a phase of the reference clock signal, to generate a locking signal and to synchronize read data with a data strobe signal using the locking signal.

In some embodiments, the coarse delay circuit may include a plurality of first delay units. Each first delay unit of the plurality of first delay units may be configured to delay the reference clock signal by a first time duration. The fine delay circuit may include a plurality of second delay units. Each second delay unit of the plurality of second delay units may be configured to delay the first clock signal by a second time duration.

In some embodiments, the first time duration may be equivalent to a maximum delay time of the fine delay circuit.

According to an aspect of the disclosure, there is provided an operating method of a memory device. The method includes receiving, at a delay locked loop, a reference clock signal of the memory device. The method further includes delaying, at a coarse delay circuit of the delay locked loop, the reference clock signal to generate a first clock signal. The method further includes delaying, at the delay locked loop, the first clock signal to generate a second clock signal. The method further includes adjusting, at the delay locked loop, a delay amount of a replica fine delay circuit of the delay locked loop based on the second clock signal. The method further includes synchronizing, at the delay locked loop, the first clock signal with the reference clock signal based on a result of the adjusting of the delay amount.

In some embodiments, the synchronizing of the first clock signal with the reference clock signal includes synchronizing, based on an output signal of the replica fine delay circuit and the reference clock signal, the first clock signal with the reference clock signal.

BRIEF DESCRIPTION OF DRAWINGS

The above and other objects and features of the present disclosure will become apparent by describing in detail embodiments thereof with reference to the accompanying drawings.

DETAILED DESCRIPTION

Figure 1:
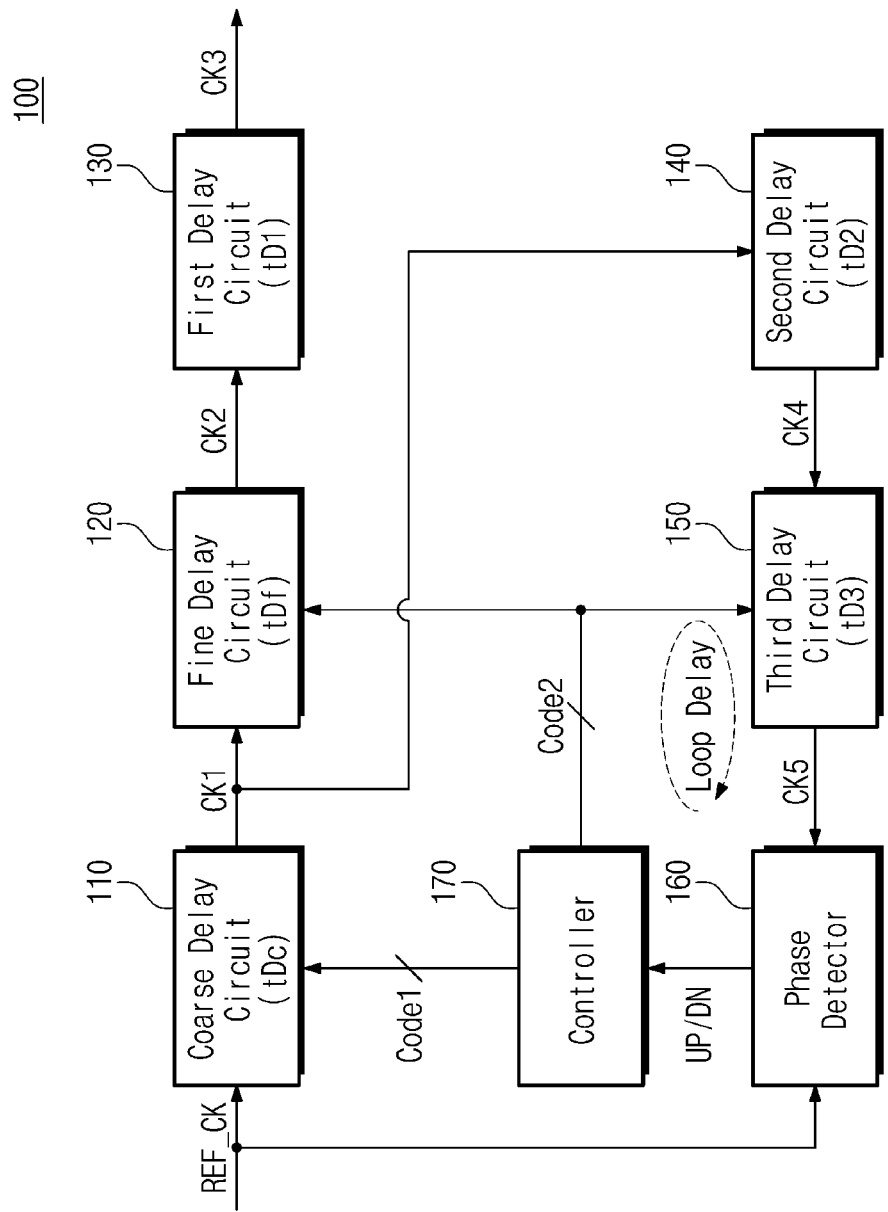
FIG. 1 is a block diagram illustrating a delay locked loop according to an embodiment of the present disclosure.

The following description with reference to the accompanying drawings is provided to assist in a comprehensive understanding of embodiments of the present disclosure defined by the claims and their equivalents. Various specific details are included to assist in understanding, but these details are considered to be exemplary only. Therefore, those of ordinary skill in the art will recognize that various changes and modifications of the embodiments described herein can be made without departing from the scope and spirit of the disclosure. In addition, descriptions of well-known functions and structures are omitted for clarity and conciseness.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Reference throughout this specification to "one embodiment," "an embodiment," or similar language means that a particular feature, structure, or characteristic described in connection with the indicated embodiment is included in at least one embodiment of the present solution. Thus, the phrases "in one embodiment", "in an embodiment," and similar language throughout this specification may, but do not necessarily, all refer to the same embodiment.

Furthermore, the described features, advantages, and characteristics of the present disclosure may be combined in any suitable manner in one or more embodiments. One skilled in the relevant art will recognize, in light of the description herein, that the present disclosure can be practiced without one or more of the specific features or advantages of a particular embodiment. In other instances, additional features and advantages may be recognized in certain embodiments that may not be present in all embodiments of the present disclosure.

FIG. 1 is a block diagram illustrating a delay locked loop according to an embodiment of the present disclosure. Referring to FIG. 1, a delay locked loop 100 may include a coarse delay circuit 110, a fine delay circuit 120, a first delay circuit 130, a second delay circuit 140, a third delay circuit 150, a phase detector 160, and a controller 170.

The coarse delay circuit 110 may receive a reference clock signal REF_CK and may delay the reference clock signal REF_CK as much as a coarse delay time tDc. It is noted herein that a certain signal being delayed as much as a certain time may indicate that the certain signal is delayed by the certain time period or duration. A first clock signal CK1 may be a signal that is obtained by delaying the reference clock signal REF_CK as much as the coarse delay time tDc. For example, the coarse delay circuit 110 may output the first clock signal CK1 after the reference clock signal REF_CK has been delayed as much as the coarse delay time tDc. The coarse delay circuit 110 may receive a first code Code1 from the controller 170. The coarse delay time tDc of the coarse delay circuit 110 may be adjusted by the first code Code1. For example, the coarse delay circuit 110 may set and/or adjust a value of the coarse delay time tDc according to the first code Code1. The coarse delay circuit 110 may be implemented with one or more of various logic circuits (e.g., an inverter, an AND operator, a NAND operator, an OR operator, a NOR operator, an XOR operator, and an XNOR operator).

The fine delay circuit 120 may receive the first clock signal CK1 and may delay the first clock signal CK1 as much as a fine delay time tDf. A second clock signal CK2 may be a signal that is obtained by delaying the first clock signal CK1 as much as the fine delay time tDf. For example, the fine delay circuit 120 may output the second clock signal CK2 after the first clock signal CK1 has been delayed as much as the fine delay time tDf. The fine delay circuit 120 may receive a second code Code2 from the controller 170. The fine delay time tDf of the fine delay circuit 120 may be adjusted by the second code Code2. For example, the fine delay circuit 120 may set and/or adjust a value of the fine delay time tDf according to the second code Code2. The fine delay circuit 120 may be implemented with one or more of various logic circuits (e.g., an inverter, an AND operator, a NAND operator, an OR operator, a NOR operator, an XOR operator, and an XNOR operator).

The first delay circuit 130 may receive the second clock signal CK2 and may delay the second clock signal CK2 as much as a first delay time tD1. The first delay circuit 130 may output the delayed clock signal as a third clock signal CK3. The third clock signal CK3 may be output to the outside of the delay locked loop 100.

In an embodiment, the first delay time tD1 of the first delay circuit 130 may not be controlled by the controller 170. Alternatively or additionally, the first delay circuit 130 may receive a code from the controller 170 that may be used to set and/or adjust the first delay time tD1 (not shown).

The delay locked loop 100 according to an embodiment of the present disclosure may be applied to electronic devices operating based on a clock signal. For example, the electronic device may include a processor, a volatile memory (e.g., a dynamic random access memory (DRAM) or a static random access memory (SRAM)), a nonvolatile memory (e.g., a NAND flash memory, a NOR flash memory, a ferroelectric random access memory (FRAM), a phase change random access memory (PRAM), a thyristor random access memory (TRAM), a magnetic random access memory (MRAM)), a solid state drive (SSD), an application specific integrated circuit (ASIC), a field programmable gate array (FPGA), a system on chip (SoC), or the like.

An electronic device that operates based on a clock signal may output data and a command to the outside in synchronization with the clock signal. Herein, the first delay circuit 130 may include a path from an input pad (not shown) through which the electronic device receives a clock signal from the outside to an output pad (not shown) through which data and a command are output to the outside, and internal circuits of the electronic device disposed on the path. Accordingly, the first delay time tD1 may include a delay time due to the above-described path and internal circuits.

That is, a clock signal skew may occur due to the above-described path and internal circuits.

The delay locked loop 100 may include the second delay circuit 140 for the purpose of improving (e.g., reducing) or removing the above-described clock signal skew. For example, the second delay circuit 140 may be configured to reduce and/or remove the above-described clock signal skew from the delay locked loop 100 that may be due to the above-described path and internal circuits. The second delay circuit 140 may be a circuit that is implemented by replicating the first delay circuit 130. That is, the second delay circuit 140 may be a circuit that is implemented by modeling a delay amount of the first delay circuit 130. The second delay circuit 140 may receive the first clock signal CK1 and may delay the first clock signal CK1 as much as a second delay time tD2. The second delay circuit 140 may output the delayed clock signal as a fourth clock signal CK4. In this case, the second delay time tD2 may be equivalent to the first delay time tD1.

The delay locked loop 100 may include the third delay circuit 150 for the purpose of improving (e.g., reducing) or removing a loop delay. For example, the third delay circuit 150 may be configured to reduce and/or remove the loop delay from the delay locked loop 100. The third delay circuit 150 may be a circuit that is implemented by replicating the fine delay circuit 120. That is, the third delay circuit 150 may be a circuit that is implemented by modeling the fine delay circuit 120. The third delay circuit 150 may receive the fourth clock signal CK4 and may delay the fourth clock signal CK4 as much as a third delay time tD3. The third delay circuit 150 may output the delayed clock signal as a fifth clock signal CK5. In this case, the third delay time tD3 may be equivalent to the fine delay time tDf.

The delay locked loop 100 according to an embodiment of the present disclosure may include the phase detector 160. The phase detector 160 may receive the fifth clock signal CK5 and the reference clock signal REF_CK and may detect a phase difference between the fifth clock signal CK5 and the reference clock signal REF_CK. For example, when a phase of the reference clock signal REF_CK is advanced with respect to a phase of the fifth clock signal CK5, the phase detector 160 may generate an up signal UP. Alternatively or additionally, in the case where the phase of the reference clock signal REF_CK is delayed with respect to a phase of the fifth clock signal CK5, the phase detector 160 may generate a down signal DN.

The controller 170 may adjust a delay amount of the coarse delay circuit 110, the fine delay circuit 120, and the third delay circuit 150 (e.g., first code Code1, second code Code2), using a detection result of the phase detector 160. In detail, the controller 170 may receive the up/down signal UP/DN. The controller 170 may generate the first code Code1 and the second code Code2 based on the up/down signal UP/DN. The coarse delay time tDc of the coarse delay circuit 110 may be adjusted by the first code Code1, and the fine delay time tDf of the fine delay circuit 120 and the third delay time tD3 of the third delay circuit 150 may be adjusted by the second code Code2.

The third delay circuit 150 may be directly controlled by the second code Code2 in the delay locked loop 100, and thus, the loop delay of the delay locked loop 100 may be improved. That is, as the third delay circuit 150 improves the loop delay of the delay locked loop 100, a locking time of the delay locked loop 100 may decrease, and a jitter due to a power noise may be reduced or removed.

In addition, the controller 170 may include a digital loop filter (not shown) for the purpose of the stability of the delay locked loop 100. For example, the digital loop filter may be configured to stabilize the delay locked loop 100. For example, the digital loop filter may accumulate the up/down signal UP/DN. An accumulation ratio of the digital loop filter may be determined with reference to a time taken to stabilize the fifth clock signal CK5 and the stability of the delay locked loop 100. That is, when the phase of the fifth clock signal CK5 is locked into the phase of the reference clock signal REF_CK, the controller 170 may generate a locking signal LOCK (e.g., locking signal LOCK of FIG. 2). The locking signal LOCK may be generated after the phase of the fifth clock signal CK5 is locked into the phase of the reference clock signal REF_CK.

In an embodiment, under the condition that the controller 170 controls the coarse delay circuit 110, the fine delay circuit 120, and the third delay circuit 150 in a digital control manner, when the phase of the fifth clock signal CK5 is locked into the phase of the reference clock signal REF_CK, a least significant bit (LSB) of the first code Code1 and/or an LSB of the second code Code2 may continue to toggle.

That is, the delay locked loop 100 may uniformly maintain a toggle timing difference "tDc+tDf+tD1" of the reference clock signal REF_CK and the third clock signal CK3. In an embodiment, the toggle timing difference "tDc+tDf+tD1" of the reference clock signal REF_CK and the third clock signal CK3 may be an integer multiple "n×tCK" (n being a natural number of 1 or more) of a reference clock signal period (tCK). As described above, because the delay locked loop 100 is unable to directly control the first delay time tD1 of the first delay circuit 130, the delay locked loop 100 may include the controllable coarse delay circuit 110 and the controllable fine delay circuit 120 to control the coarse delay time tDc and the fine delay time tDf. As such, the toggle timing difference "tDc+tDf+tD1" of the reference clock signal REF_CK and the third clock signal CK3 may be uniformly maintained.

Figure 2:
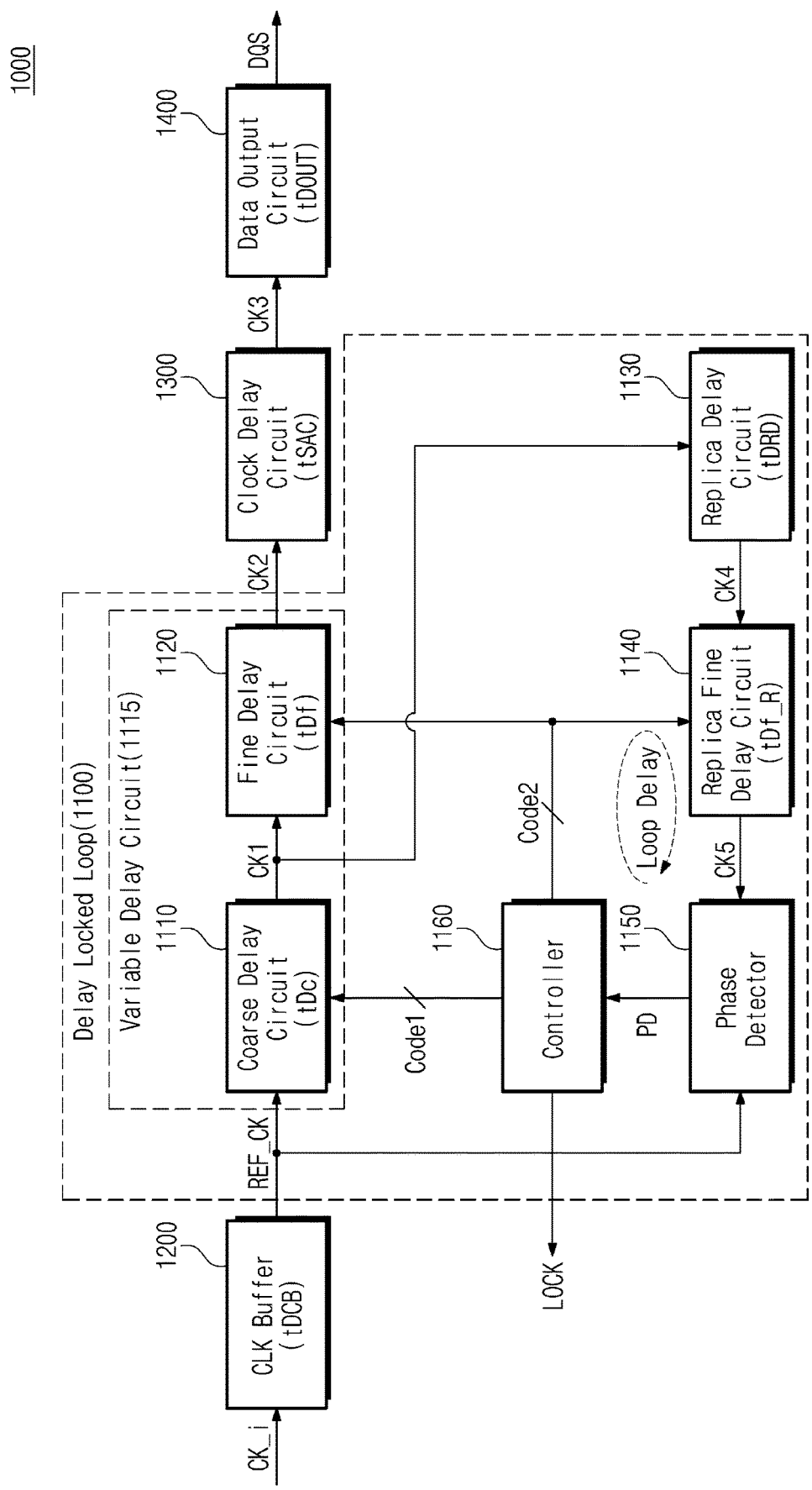
FIG. 2 is a block diagram illustrating a memory device according to an embodiment of the present disclosure.

FIG. 2 is a block diagram illustrating a memory device according to an embodiment of the present disclosure. Referring to FIG. 2, a memory device 1000 may include a delay locked loop 1100, a clock signal buffer 1200, a clock signal delay circuit 1300, and a data output circuit 1400. FIG. 2 will be described with reference to FIG. 1.

The delay locked loop 1100 may synchronize a data strobe signal DQS with the reference clock signal REF_CK received from the outside. Herein, the data strobe signal may refer to a signal for a sensing timing of write data transferred to the memory device 1000 or read data to be output from the memory device 1000. The delay locked loop 1100 may receive the reference clock signal REF_CK and may output the second clock signal CK2 to the clock signal delay circuit 1300. The delay locked loop 1100 may include or may be similar in many respects to the delay locked loop 100 described above with reference to FIG. 1 and may include additional features not mentioned above.

The clock signal buffer 1200 may output an input clock signal CK_i received from the outside to the delay locked loop 1100. In detail, the clock signal buffer 1200 may receive the input clock signal CK_i and may output the reference clock signal REF_CK to the delay locked loop 1100. Herein, the reference clock signal REF_CK may be a signal that is obtained by delaying the input clock signal CK_i as much as tDCB (e.g., a delay time of the clock signal buffer 1200).

The clock signal delay circuit 1300 may output the reference clock signal REF_CK received from the clock signal buffer 1200 to the data output circuit 1400. In detail, the clock signal delay circuit 1300 may receive the second clock signal CK2 and may output the third clock signal CK3 to the data output circuit 1400. Herein, the second clock signal CK2 may be a reference clock signal delayed by the delay locked loop 1100, and the third clock signal CK3 may be a signal that is obtained by delaying the second clock signal CK2 as much as a clock signal delay time tSAC. In this case, the clock signal delay time tSAC may correspond to the first delay time tD1 described with reference to FIG. 1. The clock signal delay circuit 1300 may include or may be similar in many respects to the first delay circuit 130 described above with reference to FIG. 1, and may include additional features not mentioned above. The clock signal delay time tSAC of the clock signal delay circuit 1300 may not be controlled by the delay locked loop 1100.

The data output circuit 1400 may receive the third clock signal CK3 and may output the data strobe signal DQS based on the third clock signal CK3. In this case, the data strobe signal DQS may correspond to a signal that is obtained by delaying the third clock signal CK3 as much as an output delay signal tDOUT. In an embodiment, the data output circuit 1400 may include internal circuits of the memory device 1000, which are placed to be close to data output pads.

Referring to FIG. 2, the delay locked loop 1100 may include a variable delay circuit 1115, a replica delay circuit 1130, a replica fine delay circuit 1140, a phase detector 1150, and a controller 1160.

The variable delay circuit 1115 may receive the reference clock signal REF_CK and may delay the reference clock signal REF_CK as much as "n×tCK−tDf_R−tDRD". Herein, "tCK" may be a period of the reference clock signal REF_CK, and "n" may be a natural number. A replica fine delay time tDf_R may refer to a delay amount of the replica fine delay circuit 1140, and a replica delay time tDRD may refer to a delay amount of the replica delay circuit 1130. In this case, the replica delay time tDRD may be equivalent to "tDCB+tSAC+tDOUT". When a delay amount of the variable delay circuit 1115 is "n×tCK−tDf_R−(tDCB+tSAC+tDOUT)", the data strobe signal DQS may be delayed with respect to the reference clock signal REF_CK as much as "n×tCK". That is, a phase of the data strobe signal DQS may be locked into a phase of the reference clock signal REF_CK. The clock signal delay circuit 1300 may include or may be similar in many respects to the first delay circuit 130 described above with reference to FIG. 1, and may include additional features not mentioned above.

The replica delay circuit 1130 may be a circuit that is implemented by replicating the clock signal buffer 1200, the clock signal delay circuit 1300, and the data output circuit 1400. That is, the replica delay circuit 1130 may be a circuit that is implemented by modeling the clock signal buffer 1200, the clock signal delay circuit 1300, and the data output circuit 1400. The replica delay circuit 1130 may receive the first clock signal CK1 and may delay the first clock signal CK1 as much as the replica delay time tDRD. The fourth clock signal CK4 may be a signal that is obtained by delaying the first clock signal CK1 as much as the replica delay time tDRD. For example, the replica delay circuit 1130 may output the fourth clock signal CK4 by delaying the first clock signal CK1 as much as the replica delay time tDRD. In this case, the replica delay time tDRD may be equivalent to "tDCB+tSAC+tDOUT". The replica delay circuit 1130 may include or may be similar in many respects to the second delay circuit 140 described above with reference to FIG. 1, and may include additional features not mentioned above.

The replica fine delay circuit 1140 may be a circuit that is implemented by replicating a fine delay circuit 1120. That is, the replica fine delay circuit 1140 may be a circuit that is implemented by modeling the fine delay circuit 1120. The replica fine delay circuit 1140 may receive the fourth clock signal CK4 and may delay the fourth clock signal CK4 as much as the replica fine delay time tDf_R. The fifth clock signal CK5 may be a signal that is obtained by delaying the fourth clock signal CK4 as much as the replica fine delay time tDf_R. For example, the replica fine delay circuit 1140 may output the fifth clock signal CK5 by delaying the fourth clock signal CK4 as much as the replica fine delay time tDf_R. When a phase of the fifth clock signal CK5 is locked into a phase of the data strobe signal DQS, the data strobe signal DQS may be synchronized with the reference clock signal REF_CK.

The phase detector 1150 may receive the fifth clock signal CK5 and the reference clock signal REF_CK. The phase detector 1150 may detect a phase difference between the fifth clock signal CK5 and the reference clock signal REF_CK. The phase detector 1150 may include or may be similar in many respects to the phase detector 160 described above with reference to FIG. 1, and may include additional features not mentioned above.

The controller 1160 may adjust a delay amount of a coarse delay circuit 1110, a fine delay circuit 1120, and the replica fine delay circuit 1140 (e.g., first code Code1, second code Code2), using a detection result of the phase detector 1150. That is, the delay locked loop 1100 may compare the fifth clock signal CK5 and the reference clock signal REF_CK to adjust a delay amount of the coarse delay circuit 1110, the fine delay circuit 1120, and the replica fine delay circuit 1140. The coarse delay time tDc of the coarse delay circuit 1110 may be adjusted by the first code Code1, and the fine delay time tDf of the fine delay circuit 1120 and the replica fine delay time tDf_R of the replica fine delay circuit 1140 may be adjusted by the second code Code2. In this case, "nxtCK−tDf_R−tDRD" of the variable delay circuit 1115 may be adjusted by the first code Code1 and the second code Code2. The controller 1160 may include or may be similar in many respects to the controller 170 described above with reference to FIG. 1, and may include additional features not mentioned above.

In another embodiment, the controller 1160 may generate the locking signal LOCK. The locking signal LOCK may be generated after the phase of the data strobe signal DQS is locked into the phase of the reference clock signal REF_CK. The locking signal LOCK may be provided to any other internal circuits (not shown) of the memory device 1000. In an embodiment, the data output circuit 1400 may synchronize read data with the data strobe signal DQS using the locking signal LOCK.

Figure 3:
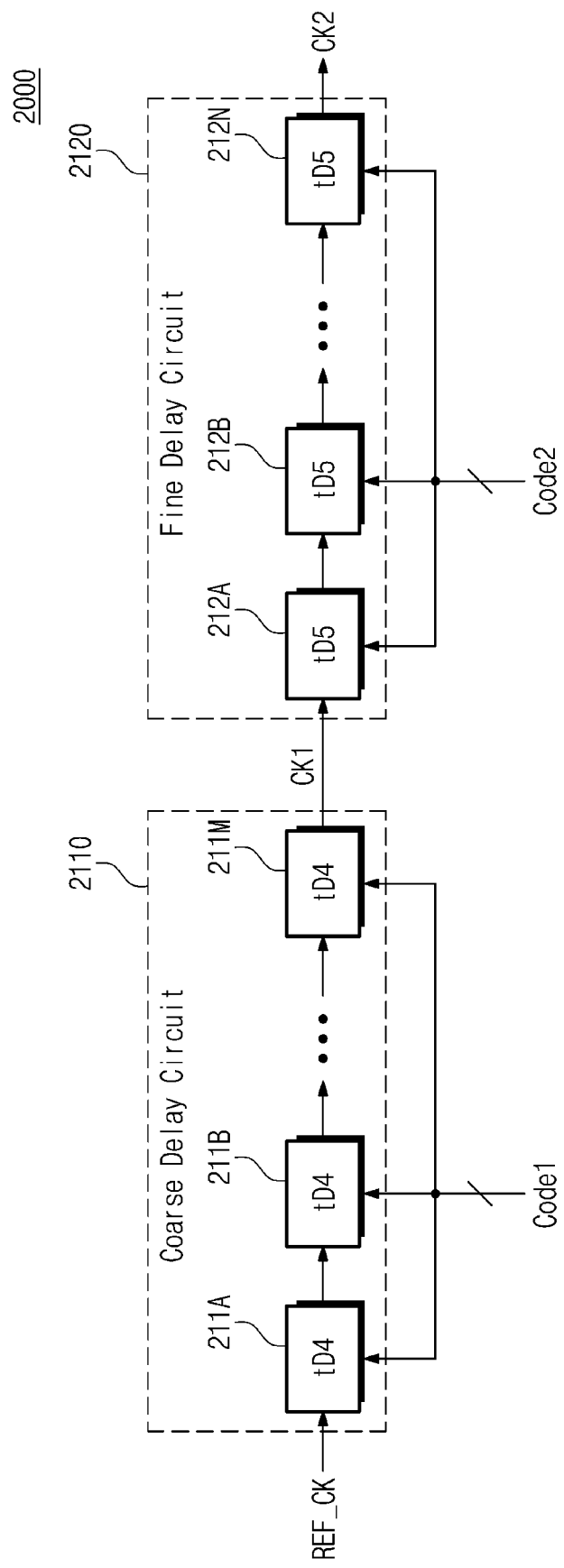
FIG. 3 is a block diagram illustrating a variable delay circuit illustrated in FIG. 2.

FIG. 3 is a block diagram illustrating a variable delay circuit as illustrated in FIG. 2. Referring to FIG. 3, a variable delay circuit 2000 may include a coarse delay circuit 2110 and a fine delay circuit 2120. FIG. 3 will be described with reference to FIG. 2. The variable delay circuit 2000 may include or may be similar in many respects to the variable delay circuit 1115 described above with reference to FIG. 2, and may include additional features not mentioned above.

The coarse delay circuit 2110 may include first delay units 211A-211M (hereinafter "211" generally), where M is a natural number greater than zero corresponding to the quantity of first delay units 211 included in the coarse delay circuit 2110. The first delay units 211 may be implemented to be equivalent to each other. A delay amount (or delay magnitude) of the first delay units 211 may be tD4. The coarse delay circuit 2110 may receive the reference clock signal REF_CK and may delay the reference clock signal REF_CK as much as a time corresponding to the first code Code1 from among "0" to "MxtD4". The coarse delay circuit 2110 may output the first clock signal CK1.

The fine delay circuit 2120 may include second delay units 212A-212N (hereinafter "212" generally), where N is a natural number greater than zero corresponding to the quantity of second delay units 212 included in the fine delay circuit 2120. The delay units 212 may be implemented to be equivalent to each other. A delay amount (or delay magnitude) of the second delay units may be tD5. The fine delay circuit 2120 may receive a delayed reference clock signal from the coarse delay circuit 2110 and may delay the delayed reference clock signal as much as a time corresponding to the second code Code2 from among "0" to "NxtD5". The fine delay circuit 2120 may output the second clock signal CK2. In an embodiment, the first delay units 211 and the second delay units 212 may be implemented with one or more of various logic circuits (e.g., an inverter, an AND operator, a NAND operator, an OR operator, a NOR operator, an XOR operator, and an XNOR operator).

In another embodiment, the first code Code1 for adjusting a delay amount of the coarse delay circuit 2110 may be equivalent to the second code Code2 for adjusting a delay amount of the fine delay circuit 2120. To delay the reference clock signal REF_CK as much as "nxtCK−tDf_R−tDRD" described with reference to FIG. 2, the controller 1160 (refer to FIG. 2) may adjust a delay amount of the coarse delay circuit 2110. As such, the controller 1160 (refer to FIG. 2) may delay the reference clock signal REF_CK based on "nxtCK−tDf_R−tDRD". After adjustment of the coarse delay circuit 2110 is completed, the controller 1160 (refer to FIG. 2) may adjust a delay amount of the fine delay circuit 2120. As such, the controller 1160 (refer to FIG. 2) may finely delay the reference clock signal REF_CK as much as "nxtCK−tDf_R−tDRD". In detail, tD4 being the delay unit of the first delay units 211 may be a maximum delay time "NxtD5" of the fine delay circuit 2120.

The variable delay circuit 2000 shows an example of the block diagram of the variable delay circuit 1115 illustrated in FIG. 2. However, the present disclosure is not limited thereto. For example, a way to set an arbitrary delay time using a coarse delay circuit and a fine delay circuit may also be applied to the second and third delay circuits 140 and 150 illustrated in FIG. 1 and the replica delay circuit 1130 and the replica fine delay circuit 1140 illustrated in FIG. 2.

Figure 4A:
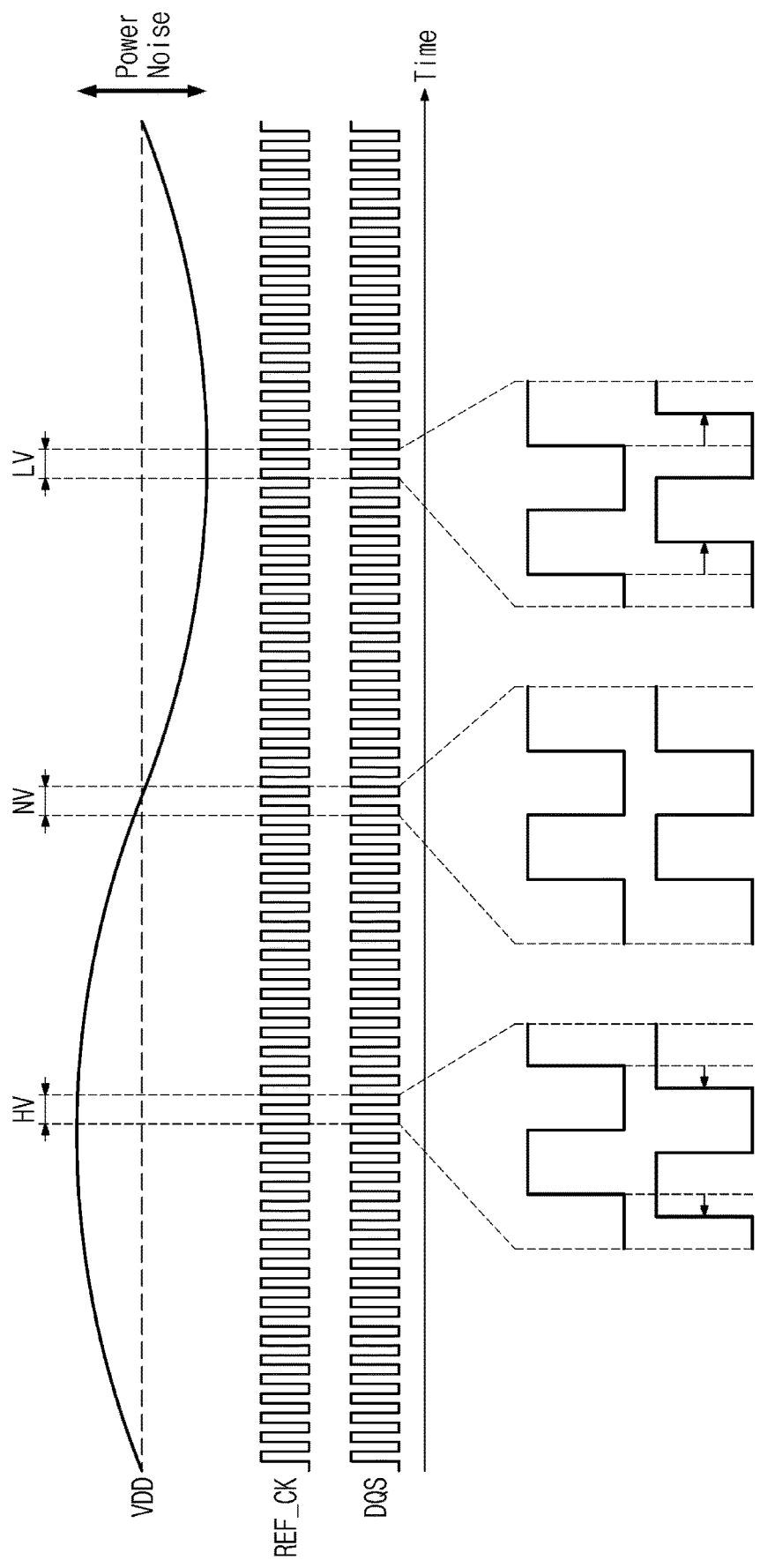
FIGS. 4A and 4B are timing diagrams illustrating an operation of a memory device illustrated in FIG. 2.
Figure 4B:
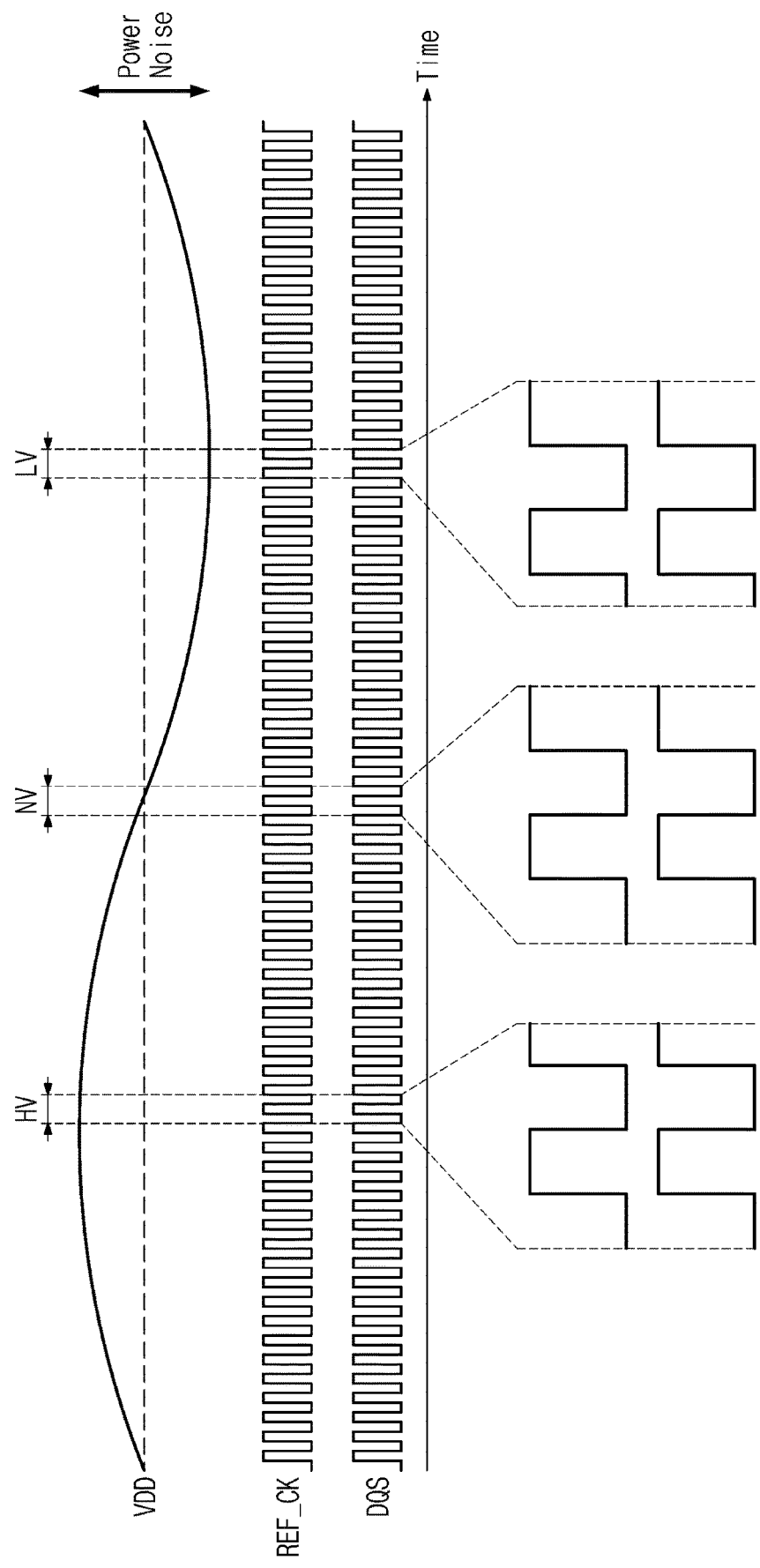

FIGS. 4A and 4B are timing diagrams illustrating an operation of a memory device illustrated in FIG. 2. FIGS. 4A and 4B will be described with reference to FIG. 2. In FIGS. 4A and 4B, a high voltage HV and a low voltage LV may be repeatedly applied to a memory device due to a power noise. FIG. 4A is a timing diagram of a memory device in which the delay locked loop 1100 is not included, and FIG. 4B is a timing diagram of the memory device 1000 of FIG. 2.

Referring to FIG. 4A, in the case where the high voltage HV is applied to the memory device, a phase of the data strobe signal DQS may be advanced with respect to a phase of the reference clock signal REF_CK. In detail, in the high voltage HV, a delay of a delay locked loop may decrease, and a toggle timing of an output clock signal of the delay locked loop may be advanced. Accordingly, a locking time of the delay locked loop may shorten, and the phase of the data strobe signal DQS may be advanced with respect to the phase of the reference clock signal REF_CK. In the case where the low voltage LV is applied to the memory device, the phase of the data strobe signal DQS may be delayed with respect the a phase of the reference clock signal REF_CK. In detail, at the low voltage LV, the delay of the delay locked loop may increase, and the toggle timing of the output clock signal of the delay locked loop may be delayed. Accordingly, the locking time of the delay locked loop may increase, and the phase of the data strobe signal DQS may be delayed with respect to the phase of the reference clock signal REF_CK. In this case, a phase change period may correspond to a time period from a time when a phase of a clock signal is changed to a time when an edge of the clock signal whose phase is changed reaches a phase detector.

Referring to FIG. 4B, a phase of the data strobe signal DQS of the memory device 1000 including the delay locked loop 1100 may be equivalent to a phase of the reference clock signal REF_CK at the high voltage HV and the low voltage LV. That is, the delay locked loop 1100 may improve and/or remove a jitter due to a power noise.

Figure 5A:
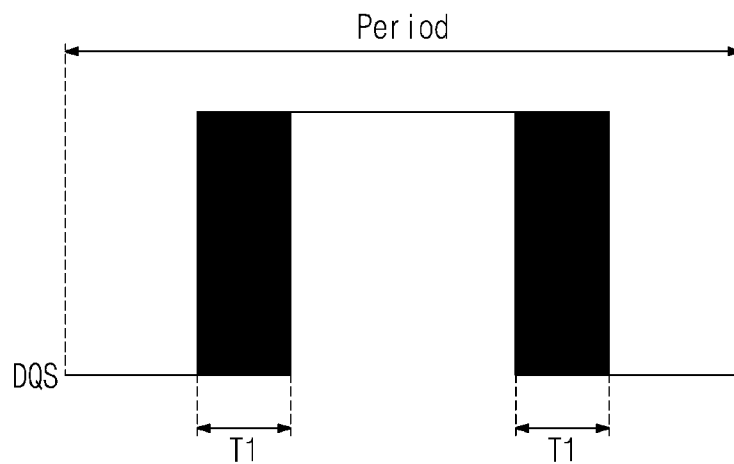
FIGS. 5A and 5B are timing diagrams illustrating a result of an operation of a memory device illustrated in FIG. 2.
Figure 5B:
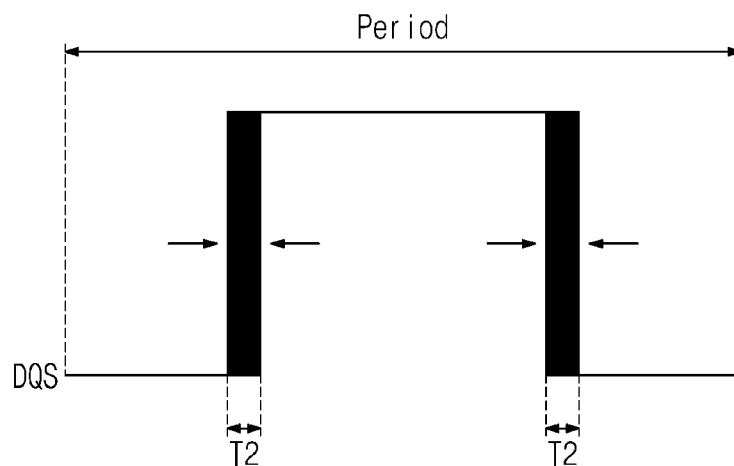

FIGS. 5A and 5B are timing diagrams illustrating a result of an operation of a memory device illustrated in FIG. 2. FIG. 5A is a timing diagram in which the data strobe signal DQS of a memory device in which the delay locked loop 1100 is not included is accumulated during 10,000 cycles or more, with the data strobe signal DQS divided for each period. FIG. 5B is a timing diagram in which the data strobe signal DQS of a memory device in which the delay locked loop 1100 is included is accumulated during 10,000 cycles or more, with the data strobe signal DQS divided for each period.

Referring to FIG. 5A, a jitter of the memory device in which the delay locked loop 1100 of FIG. 2 is not included may occur in a first time interval T1. That is, the data strobe signal DQS of the memory device in which the delay locked loop 1100 of FIG. 2 is not included may experience a significant phase change due to a power noise.

Referring to FIG. 5B, a jitter of the memory device in which the delay locked loop 1100 of FIG. 2 is included may occur in a second time interval T2. That is, the data strobe signal DQS of the memory device in which the delay locked loop 1100 of FIG. 2 is included may experience a small phase change due to a power noise. In this case, the first time interval T1 may be longer than the second time interval T2.

Figure 6:
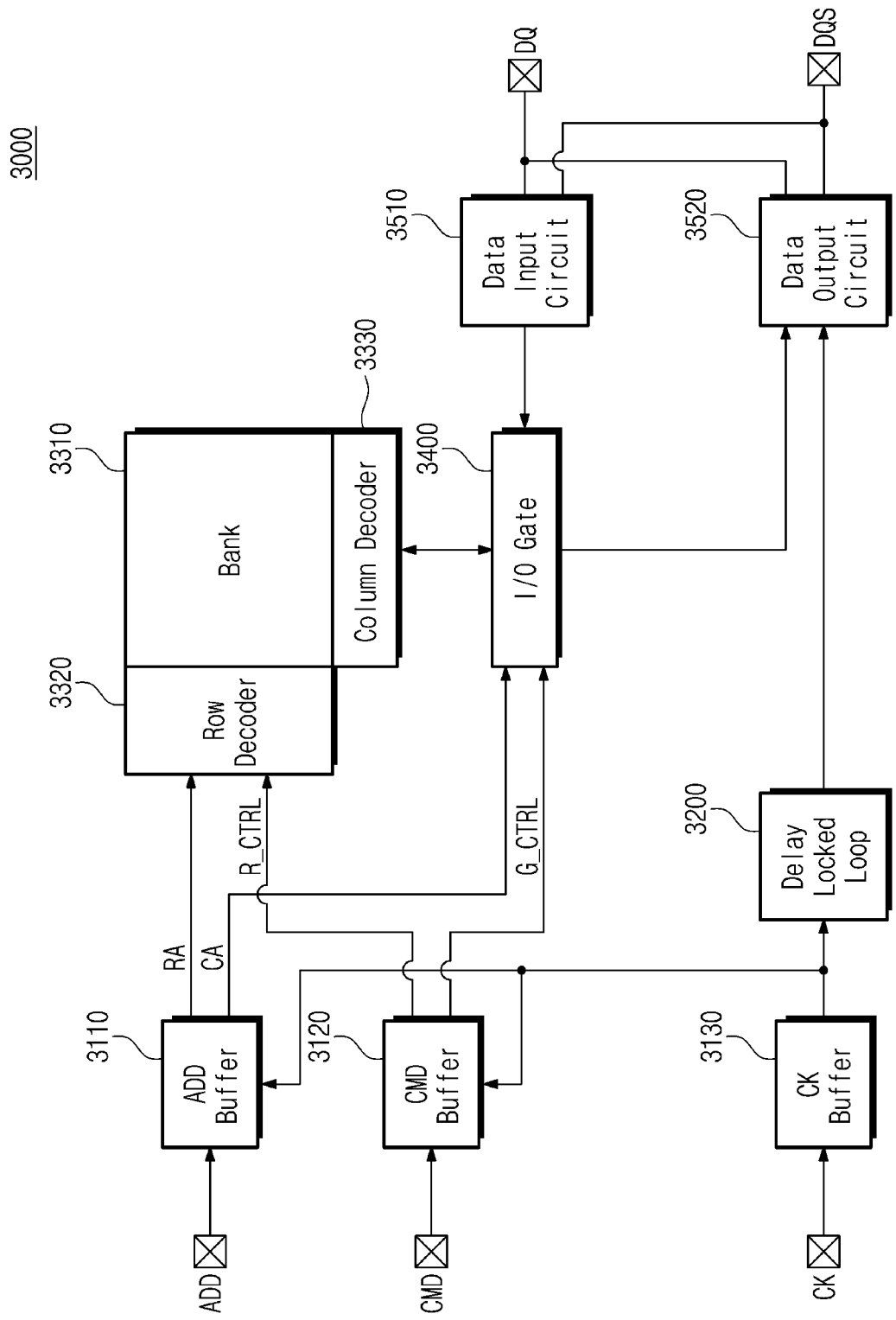
FIG. 6 is a block diagram illustrating a memory device to which a delay locked loop according to an embodiment of the present disclosure is applied.

FIG. 6 is a block diagram illustrating a memory device to which a delay locked loop according to an embodiment of the present disclosure is applied. Referring to FIG. 6, a memory device 3000 may include an address buffer 3110, a command decoder 3120, a clock signal buffer 3130, a delay locked loop 3200, a bank 3310, a row decoder 3320, a column decoder 3330, an input/output gate 3400, a data input circuit 3510, and a data output circuit 3520. The memory device 3000 may include or may be similar in many respects to the variable memory device 1000 described above with reference to FIG. 2, and may include additional features not mentioned above.

The address buffer 3110 may receive an address ADD from the outside through an address pad. The address buffer 3110 may operate in synchronization with a clock signal output from the clock signal buffer 3130. The address buffer 3110 may provide a row address RA and a column address CA to the row decoder 3320 and the column decoder 3330, respectively.

The command decoder 3120 may receive various commands CMD from the outside through a command pad. The command decoder 3120 may operate in synchronization with the clock signal output from the clock signal buffer 3130. In an embodiment, the command CMD may include an activate command ACT, a read command RD, or a write command WR. The command decoder 3120 may decode a write enable signal WE, a row address strobe signal RAS, a column address strobe signal CAS, an active signal ACT, a chip select signal CS, an address signal from the address buffer 3110, and the like. The command decoder 3120 may decode a command CMD and may generate a row decoder control signal R_CTRL and an input/output gate control signal G_CTRL.

The clock signal buffer 3130 may receive the reference clock signal REF_CK through a clock signal pad. The clock signal buffer 3130 may provide the reference clock signal REF_CK to internal circuits of the memory device 3000 illustrated in FIG. 6 and internal circuits not illustrated in FIG. 6.

The delay locked loop 3200 may compensate for a delay "tDCB+tSAC+tDOUT" inevitably occurring until the reference clock signal REF_CK is output as the data strobe signal DQS. Because the delay locked loop 3200 according to an embodiment of the present disclosure accurately replicates the delay time tDCB, the clock signal delay time tSAC, and the output delay signal tDOUT, a skew between the data strobe signal DQS and the reference clock signal REF_CK and a data valid window tDV may be improved. Referring to FIG. 6, the delay locked loop 3200 may receive the reference clock signal REF_CK through the clock signal buffer 3130.

The bank 3310 may be a memory cell array. For brevity of drawing, only one bank 3310 is illustrated in FIG. 6, but the memory device 3000 may include a plurality of banks. The size of the bank 3310 and/or the number of banks may comply with the protocol or specification. The bank 3310 may be controlled by the row decoder 3320 and the column decoder 3330.

The row decoder 3320 may control word lines WL (not shown) in response to the row address RA and the row decoder control signal R_CTRL. In detail, the row decoder 3320 may select an arbitrary word line when the memory device 3000 receives the activate command from the outside.

In response to the activate command, the column decoder 3330 may read data of memory cells connected with the selected word line through bit lines BL (not not shown). When a read command or a write command is received from the outside, the memory device 3000 may output data selected by the input/output gate 3400 and/or may modify data selected by the input/output gate 3400.

The input/output gate 3400 may receive the column address CA and the input/output gate control signal G_CTRL. The input/output gate 3400 may transfer write data from the data input circuit 3510 to the column decoder 3330 in response to the column address CA. The input/output gate 3400 may transfer data of the column decoder 3330 to the input/output gate 3400 in response to the column address CA. The input/output gate 3400 may output data from the column decoder 3330 to the data output circuit 3520.

The data input circuit 3510 may output write data received through a data pad to the input/output gate 3400. In this case, the data input circuit 3510 may receive the data bus strobe DQS together through a data strobe pad.

The data output circuit 3520 may output the read data through the data pad. The data output circuit 3520 may be provided with the read data from the input/output gate 3400. In this case, the data output circuit 3520 may output the data strobe signal DQS through the data strobe pad.

Figure 7:
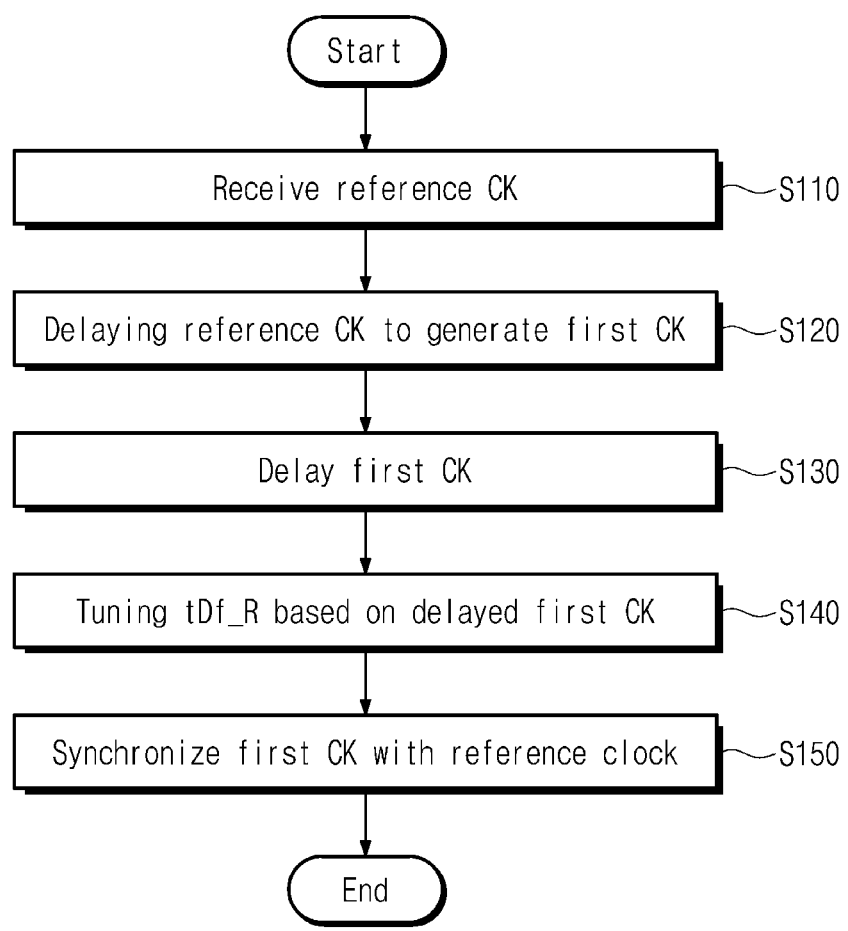
FIG. 7 is a flowchart illustrating an operation of a memory device according to an embodiment of the present disclosure.

FIG. 7 is a flowchart illustrating an operation of a memory device according to an embodiment of the present disclosure. FIG. 7 will be described with reference to FIG. 2.

In operation S110, the delay locked loop 1100 may receive the reference clock signal REF_CK. In detail, the coarse delay circuit 1110 of the delay locked loop 1100 may receive the reference clock signal REF_CK.

In operation S120, the delay locked loop 1100 may delay the reference clock signal REF_CK to generate the first clock signal CK1. In detail, the coarse delay circuit 1110 of the delay locked loop 1100 may receive the reference clock signal REF_CK to generate the first clock signal CK1.

In operation S130, the delay locked loop 1100 may delay the first clock signal CK1. In detail, the replica delay circuit 1130 of the delay locked loop 1100 may receive the first clock signal CK1 from the coarse delay circuit 1110 and may delay the first clock signal CK1 as much as the replica delay time tDRD. The fourth clock signal CK4 may be a signal that is obtained by delaying the first clock signal CK1 as much as the replica delay time tDRD. In this case, the replica delay time tDRD may be equivalent to "tDCB+tSAC+tDOUT".

The replica fine delay circuit 1140 may receive the fourth clock signal CK4 and may delay the fourth clock signal CK4 as much as the replica fine delay time tDf_R. The fifth clock signal CK5 may be a signal that is obtained by delaying the fourth clock signal CK4 as much as the replica fine delay time tDf_R.

In operation S140, the delay locked loop 1100 may tune a delay amount of a replica fine delay circuit based on the first clock signal CK1 thus delayed. In detail, the phase detector 1150 of the delay locked loop 1100 may receive a signal output from the replica fine delay circuit 1140 and the reference clock signal REF_CK and may detect a phase difference between the signal output from the replica fine delay circuit 1140 and the reference clock signal REF_CK. The controller 1160 may tune a delay amount of the coarse delay circuit 1110, the fine delay circuit 1120, and the replica fine delay circuit 1140 based on a detection result of the phase detector 1150.

In operation S150, the delay locked loop 1100 may synchronize the first clock signal CK1 with the reference clock signal REF_CK. In detail, the phase detector 1150 of the delay locked loop 1100 may receive the signal output from the replica fine delay circuit 1140 and the reference clock signal REF_CK and may detect a phase difference between the signal output from the replica fine delay circuit 1140 and the reference clock signal REF_CK. The controller 1160 may synchronize the first clock signal CK1 with the reference clock signal REF_CK based on a detection result of the phase detector 1150.

According to an embodiment of the present disclosure, a delay locked loop and a memory device including the same may control a replica fine delay circuit to reduce a loop delay. As such, a delay time of the delay locked loop may decrease, and a jitter due to a power noise may be improved or removed.

Each of the embodiments provided in the above description is not excluded from being associated with one or more features of another example or another embodiment also provided herein or not provided herein but consistent with the disclosure. For example, even if matters described in a specific example or embodiment are not described in a different example or embodiment, the matters may be understood as being related to or combinable with the different example or embodiment. In addition, it should be understood that all descriptions of principles, aspects, examples, and specific embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A delay locked loop apparatus, comprising:
   a coarse delay circuit configured to delay a reference clock signal to generate a first clock signal;
   a fine delay circuit configured to delay the first clock signal to generate a second clock signal;
   a first delay circuit configured to delay the second clock signal to generate a third clock signal;
   a second delay circuit configured to delay the first clock signal to generate a fourth clock signal;
   a third delay circuit configured to delay the fourth clock signal to generate a fifth clock signal;
   a phase detector configured to detect a phase difference between the reference clock signal and the fifth clock signal; and
   a controller configured to adjust, based on a detection result of the phase detector, a first delay amount of the coarse delay circuit, a second delay amount of the fine delay circuit and a third delay amount of third delay circuit.

2. The delay locked loop apparatus of claim 1, wherein the third delay circuit is configured to replicate the fine delay circuit.

3. The delay locked loop apparatus of claim 2, wherein the second delay circuit is configured to replicate the first delay circuit.

4. The delay locked loop apparatus of claim 2, wherein the controller is configured to adjust the second delay amount of the fine delay circuit and the third delay amount of the third delay circuit after having adjusted the first delay amount of the coarse delay circuit.

5. The delay locked loop apparatus of claim 2, wherein
   the coarse delay circuit comprises a plurality of first delay units, each first delay unit of the plurality of first delay units being configured to delay the reference clock signal by a first time duration, and
   the fine delay circuit comprises a plurality of second delay units, each second delay unit of the plurality of second delay units being configured to delay the first clock signal by a second time duration.

6. The delay locked loop apparatus of claim 5, wherein the first time duration is equivalent to a maximum delay time of the fine delay circuit.

7. The delay locked loop apparatus of claim 2, wherein the controller is further configured to:
   generate a first code and a second code;
   adjust, using the first code, the first delay amount of the coarse delay circuit; and
   adjust, using the second code, the second delay amount of the fine delay circuit and the third delay amount of the third delay circuit.

8. The delay locked loop apparatus of claim 2, wherein the delay locked loop apparatus is configured to output a synchronization signal in response to the third clock signal being synchronized with the reference clock signal.

9. The delay locked loop apparatus of claim 2, wherein the controller is further configured, based on a phase of the fifth clock signal being locked into a phase of the reference clock signal, to generate a locking signal and to synchronize read data with a data strobe signal using the locking signal.

10. A memory device, comprising:
    a clock signal delay circuit configured to receive a reference clock signal and to provide the reference clock signal to an output circuit; and
    a delay locked loop comprising a replica fine delay circuit configured to replicate a fine delay circuit, a variable delay circuit, and a replica delay circuit,
    wherein the variable delay circuit comprises a coarse delay circuit and the fine delay circuit,
    wherein the coarse delay circuit is configured to delay the reference clock signal to generate a first clock signal,
    wherein the fine delay circuit is configured to delay the first clock signal to generate a second clock signal,
    wherein the replica delay circuit is configured to delay the first clock signal to generate a fourth clock signal, and
    wherein the replica fine delay circuit is configured to delay the fourth clock signal to generates a fifth clock signal.

11. The memory device of claim 10, wherein the delay locked loop further comprises:
    a phase detector configured to receive the reference clock signal and the fifth clock signal and to detect a phase difference between the reference clock signal and the fifth clock signal; and
    a controller configured to generate a first code and a second code based on a detection result of the phase detector.

12. The memory device of claim 11, wherein the controller is further configured to:
    adjust, using the first code, a first delay amount of the coarse delay circuit; and
    adjust, using the second code, a second delay amount of the fine delay circuit and a third delay amount of the replica fine delay circuit.

13. The memory device of claim 11, further comprising:
    a clock signal buffer configured to receive an input clock signal from outside of the memory device and to generate the reference clock signal.

14. The memory device of claim 13, wherein the replica delay circuit is further configured to replicate the clock signal buffer, the clock signal delay circuit, and the output circuit.

15. The memory device of claim 11, further comprising a data output circuit configured to output a data strobe signal that is synchronized with the reference clock signal based on a read command received from outside of the memory device.

16. The memory device of claim 11, wherein the controller is further configured, based on a phase of the fifth clock signal being locked into a phase of the reference clock signal, to generate a locking signal and to synchronize read data with a data strobe signal using the locking signal.

17. The memory device of claim 11, wherein
    the coarse delay circuit comprises a plurality of first delay units, each first delay unit of the plurality of first delay units being configured to delay the reference clock signal by a first time duration, and
    the fine delay circuit comprises a plurality of second delay units, each second delay unit of the plurality of second delay units being configured to delay the first clock signal by a second time duration.

18. The memory device of claim 17, wherein the first time duration is equivalent to a maximum delay time of the fine delay circuit.

19. An operation method of a memory device, the operation method comprising:
    receiving, at a delay locked loop of the memory device, a reference clock signal;
    delaying, at a coarse delay circuit of the delay locked loop, the reference clock signal to generate a first clock signal;
    delaying, at the delay locked loop, the first clock signal to generate a second clock signal;
    adjusting, at the delay locked loop, a delay amount of a replica fine delay circuit of the delay locked loop based on the second clock signal; and
    synchronizing, at the delay locked loop, the first clock signal with the reference clock signal based on a result of the adjusting of the delay amount.

20. The operation method of claim 19, wherein the synchronizing of the first clock signal with the reference clock signal comprises synchronizing, based on an output signal of the replica fine delay circuit and the reference clock signal, the first clock signal with the reference clock signal.

* * * * *